United States Patent [19]
Kaminski

[11] Patent Number: 5,894,483
[45] Date of Patent: Apr. 13, 1999

[54] INTEGRATED CIRCUIT ARRANGEMENT

[75] Inventor: Krzysztof Kaminski, Tullinge, Sweden

[73] Assignee: Telefonaktiebolaget LM Ericsson, Stockholm, Sweden

[21] Appl. No.: 08/894,463

[22] PCT Filed: Mar. 4, 1996

[86] PCT No.: PCT/SE96/00286

§ 371 Date: Aug. 19, 1997

§ 102(e) Date: Aug. 19, 1997

[87] PCT Pub. No.: WO96/28781

PCT Pub. Date: Sep. 19, 1996

[30] Foreign Application Priority Data

Mar. 16, 1995 [SE] Sweden .................. 9500934

[51] Int. Cl.⁶ .................. G01R 31/28; G06F 11/00
[52] U.S. Cl. .................. 371/24; 371/22.1
[58] Field of Search .................. 371/24, 22.1

[56] References Cited

U.S. PATENT DOCUMENTS 5,260,949  11/1993  Hashizume et al. .......... 371/22.3
5,281,864   1/1994  Hahn et al. .............. 307/272.2

FOREIGN PATENT DOCUMENTS 0 358 365 A2  3/1990  European Pat. Off.
0 358 371 A2  3/1990  European Pat. Off.
0 358 376 A2  3/1990  European Pat. Off.
0 511 752 A1  4/1992  European Pat. Off.
0 514 700 A2 11/1992  European Pat. Off.
0 589 223 A2  3/1994  European Pat. Off.

Primary Examiner—Phung M. Chung
Attorney, Agent, or Firm—Burns, Doane, Swecker & Mathis, L.L.P.

[57] ABSTRACT

The invention comprises an integrated circuit arrangement (1) with several internal-related function blocks (such as 42) and edge-related bond pads (2 ... 2k; 3 ... 3k), whereby each of several selected pads is equipped with a test cell (2' ... 2k'; 3' ... 3k'); a first test cell for incoming signal structures at a first set of pads; and a second test cell (3k') for outgoing signal structures at a second set of pads. The test cells can, through internal connecting conductors, be connected to at least one function block (42). Each second test cell (3k') is equipped with a multiplexer (31), which can be controlled by means of a mode-selecting signal (32) to pass along either a signal pattern (43b1) that relates to a function block, or a signal pattern (33) that is received from a selected function block, in the form of a test signal. Each second test cell (3k') is equipped with an added multiplexer (38) where the output is, directly (or indirectly), connected to a test signal-related input of said multiplexer (31). A test signal (42b1), which originates from a function block that has been selected to be tested, is connected to at least one input of said added multiplexer (38). Said added multiplexer (38) may also be controlled by means of a mode-selecting signal (38a).

16 Claims, 4 Drawing Sheets

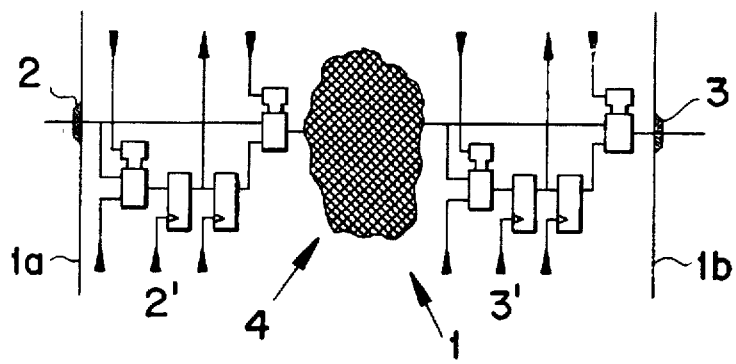
Fig. 1
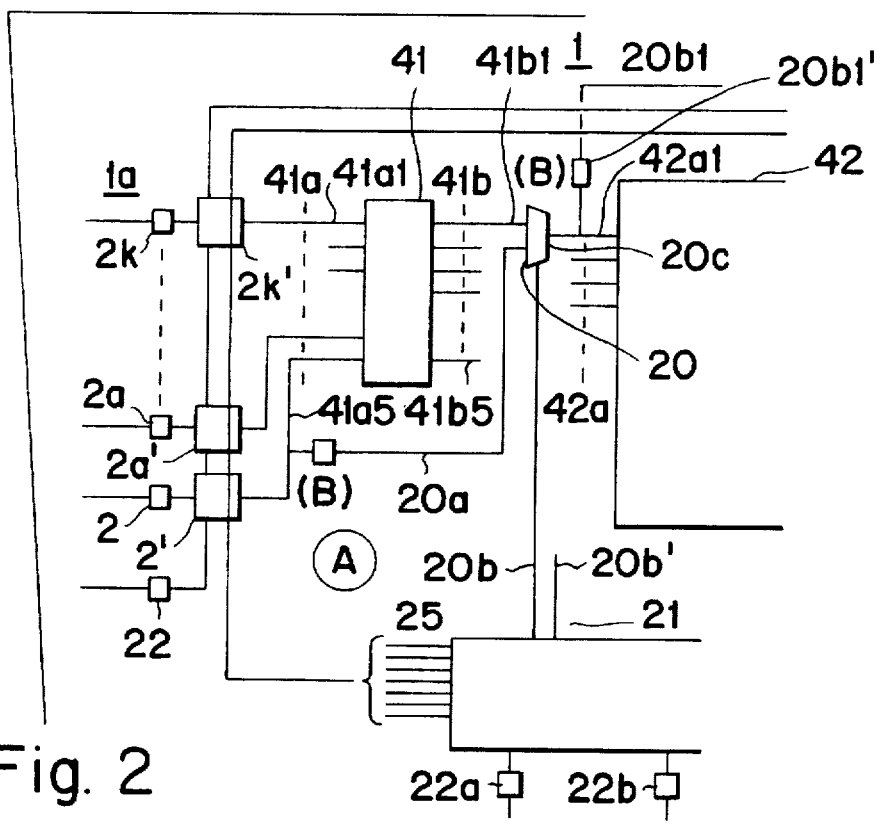
Fig. 2
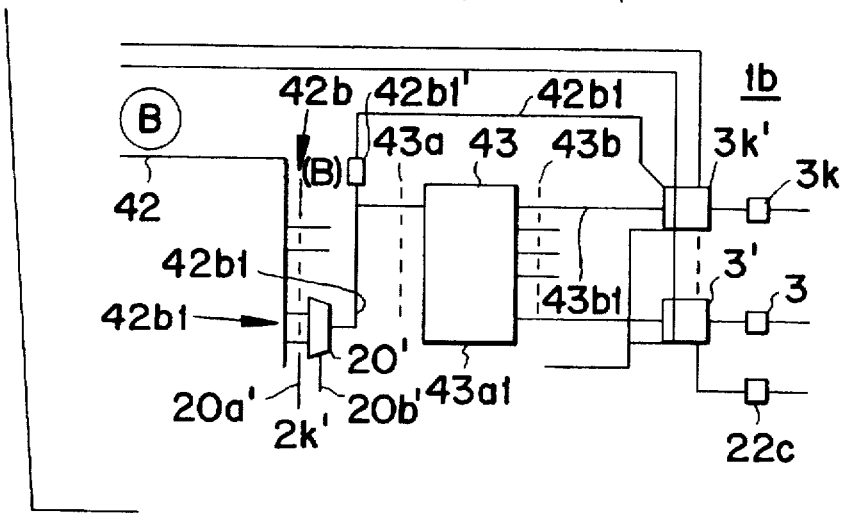

Fig. 5
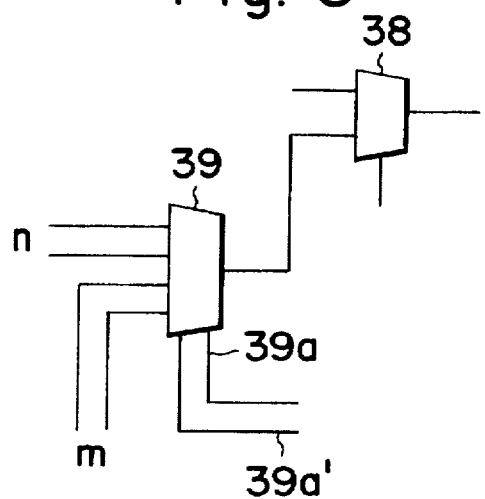
Fig. 6
| 421 | 422 | 423 |
| --- | --- | --- |
| 424 | 425 | 426 |
| 427 | 428 | 429 |
42
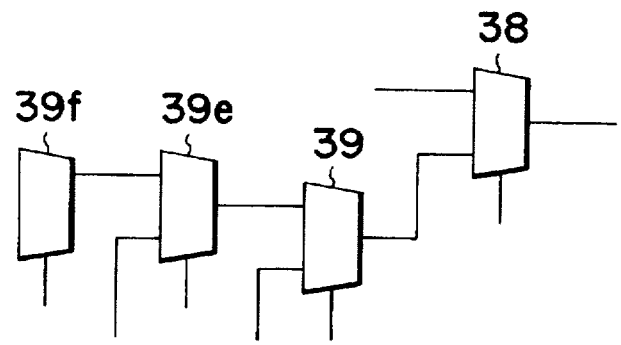
Fig. 7

Fig. 8
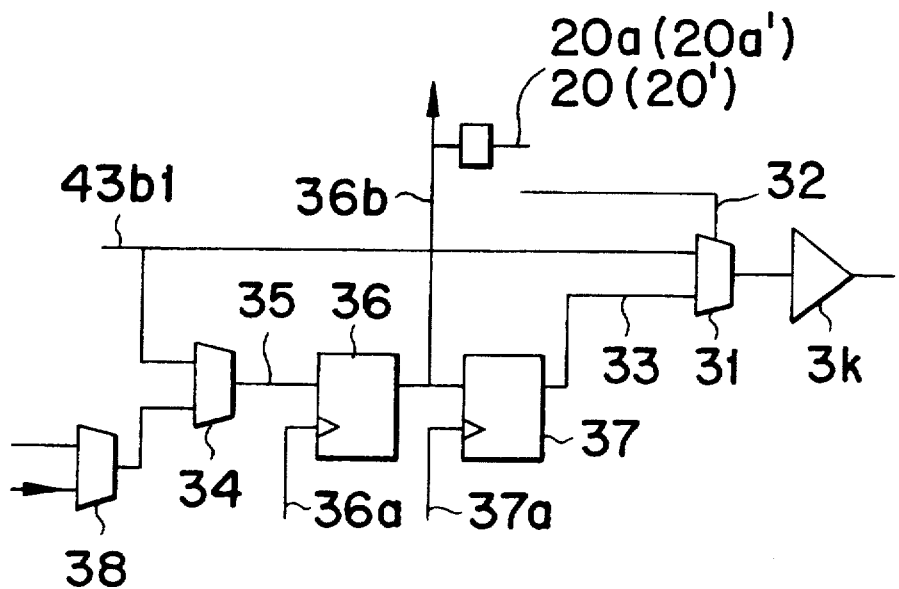
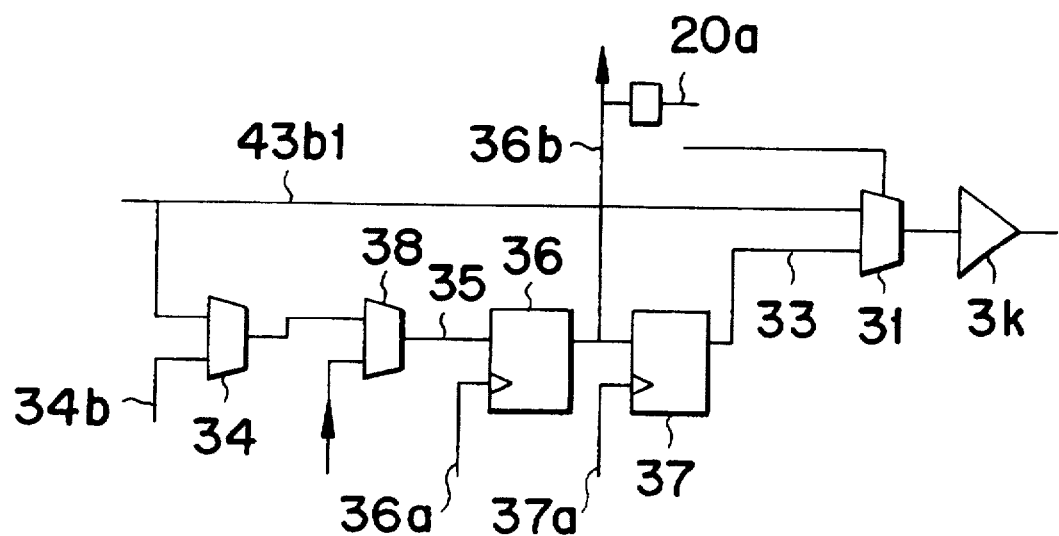
Fig. 9

INTEGRATED CIRCUIT ARRANGEMENT

TECHNICAL FIELD

The present invention relates to an integrated circuit arrangement; more specifically, it relates to a circuit arrangement that is equipped with edge-oriented terminals or pins, or similar means of connection, hereafter called connecting isles or bond pads.

Integrated circuit arrangements of this kind are adapted to process, in a controlled manner, the structure of incoming signals that appears at bond pads or at input pads in internal function blocks, in order to generate a signal pattern at bond pads for outgoing signals or at output pads.

The invention is based on the potential for using a circuit arrangement that belongs to the integrated circuit, and is adapted so that it may be used to test the internal function blocks of the integrated circuit by verifying that a selected signal structure at the input pads results in a determined signal pattern at the output pads when a function works correctly. If there is a lack of agreement, the testing equipment used generates an error-indicating signal.

The present invention is specifically adapted to be used with relatively large integrated circuit arrangements that may be divided into other, large or small, "discrete" physical and/or logical function blocks.

The input node and the output node that belong to each function block, or group of function blocks, that is to be tested must be available to the input and output pads that belong to the integrated circuit arrangement.

Further, the present invention is intended to present an integrated circuit arrangement in which a predetermined number of bond pads, divided into input and output pads, belong to test cells that are meant to make available a digital signal structure, that is adapted to provide a test of the integrated circuit as described above.

It may be specifically pertinent to use test cells that are based on the principles of Boundary-Scan architecture, specifically standardized Boundary-Scan architecture.

It should be noticed that standardized Boundary-Scan cells (BS-cells) have a first active circuit configuration for the input pads (BS-input cells), a second active circuit configuration for output pads (BS-output-cells), and a third active circuit configuration for I/O-pads, with a bond pad for incoming or outgoing signal direction. There is also a fourth standardized BS-cell for activating signals at tri-state outputs and for I/O-pad cells. However, this BS-cell has no specific function relative to the conditions of the present invention, and therefore is not mentioned hereafter.

Only BS-input cells for input pads, or BS-output cells for output pads, will be shown in the description that follows and in the Claims, since the circuit configuration for BS-cells, such as an I/O-pad, can easily be used solely as a BS-input cell for input pads or as a BS-output cell for output pads.

According to the present invention, it is true that the pictured circuit arrangement is primarily based on the Boundary-Scan application. However, any modification required to apply the inventive thought to another circuit arrangement, using any kind of test cell at the input pads, output pads, and/or I/O-pads, is obvious for a person skilled in the art.

Thus, the present invention is based on the knowledge that to perform an adequate test of integrated circuits and the function blocks that belong to them, specifically structured testing vectors must be used; for example, to apply a signal structure of logical values, '1's and '0's, to selected input pads.

These tests are necessary since, when integrated circuits are produced, it is not uncommon for one of the nodes in the circuit to stuck at '1' or '0'. Obviously, these errors must be discovered.

The testing vectors are designed according to an algorithm whose purpose is to discover every node, within a given integrated circuit, that is stuck at '1' or '0'.

The present invention is generally based on the condition that the integrated circuit can be equipped with test cells that are related to the input and output pads.

The test cells for the input pads must have a circuit connection that, during a given condition, permits a functional signal structure intended to be used in a normal signal processing to be passed to the integrated function blocks with the shortest possible time-lag.

The test cells for the output pads must have a circuit connection that, during a given condition, permits a functional signal structure generated by a normal signal process to be passed from the integrated function blocks to the output pads with the shortest possible time-lag.

A standardized BS-output cell of this kind includes, for these purposes, a multiplexer, which belongs to a driver circuit, that by means of a mode-selecting signal may be directed to pass either a signal that is related to a function block or a signal from a memory unit that belongs to the test cell.

A standardized BS-cell also provides a number of flip-flops, which are affected by various clock signals; and an input multiplexer, which can be connected for purposes other than those related to the present invention, in order to sample the functional signal or the signal pattern from an adjacent function block.

BS-cells with this circuit configuration may be used as both BS-input cells and BS-output cells.

DESCRIPTION OF THE BACKGROUND ART

With regards to the features of the present invention, it is true that various kinds of integrated circuits are previously known where each input pad, output pad, and/or I/O-pad is equipped with, or coacts with, a test cell, thereby making it possible to test the complete integrated circuit.

Tests of this kind are performed either by applying required testing vectors to the input pads of the integrated circuit, or by applying necessary testing vectors through available test cells; for example, BS-cells.

The results of processing test vectors within the integrated circuit are observed at the output pads of the integrated circuit or through BS-output cells.

Regarding the illustrated embodiments in the description that follows, it can be mentioned that the circuit connections of the test cells may be of a standardized BS-structure.

Various circuit arrangements for the applications described above, and for the BS-cells that are connected to one other in order to form a Boundary-Scan-loop, hereafter called a BS-loop, are known and were previously shown through the publication IEEE Standard 1149.1 under the heading "IEEE Standard Test Access Port and Boundary-Scan Architecture".

Taking further notice of the feature of the present invention, and the primary application of a test cell or an output cell with an output pad, it can be mentioned, as an example of prior art, what was shown and described through the U.S. Pat. No. 5,319,646.

This publication is relevant since it describes a BS-output cell that is based on the basic circuit connection principally shown and described in FIG. 1 in the present application.

This circuit connection shows a BS-output cell with supplementary details such as a multiplexer 12; a selecting element 14; a shift register 16; and a hold element 18. The multiplexer 12 samples either critical data from a system logic that is separated from the BS-output cell through the control circuit 20, or test data from an earlier BS-output cell.

A first test-controlling circuit 19, in the form of an AND-gate, is connected to the selecting element 14.

With regards to supplementing prior art, it must also be mentioned that through the U.S. Pat. No. 5,347,520 it was previously made known that a BS-cell may be supplemented for activation connection (Enable Cell), and to connect a first test-controlling circuit 21 to the selecting element 14 while using several logical elements 24–28 in the form of NAND-gates.

What was shown and described in the U.S. Pat. Nos. 5,222,068; 5,042,034; 5,056,094 and 5,084,874 also belongs to prior art.

What was shown and described in the European patent publications 0,358,365; 0,358,371; 0,358,376; 0,514,700 and 0,589,223 also belongs to prior art.

The content of the U.S. Pat. No. 5,254,940 make known the requirements for creating, within an integrated circuit, the conditions for enabling, by means of multiplexers, a direct connection between the input nodes that belong to a selected integrated function block and the input pads that belong to the integrated circuit and a corresponding connection for the output nodes and pads.

The ability to test individual and selected function blocks through multiplexers is shown here. As shown, the connection of multiplexers gives access to the input and output nodes of internal function blocks through the input and output pads of the integrated circuit. However, because said multiplexers are a part of the functional signal path, they will cause an extra time-lag for the signals that appear at the functional signal path in question.

The publication does not indicate the use of test cells.

What was shown and described in the U.S. Pat. Nos. 5,331,571; 5,377,144; 5,195,050; 5,221,865; 5,230,000 and 5,225,834 also belongs to prior art.

With respect to the general tendencies within this technical field, it is clear that developments are such that the integrated circuit arrangements, which are available through producers and suppliers, are increasing in size (expected development of one million or more useable gate equivalents) with increasingly large and more complex function blocks and more complex coaction between the function blocks.

At the same time, testing systems and methods are growing in size and complexity, being accompanied by a rapid increase in the complexity and number of testing vectors that will be required.

Since the time for testing integrated circuits is valuable, and must therefore be kept short, great efforts are required to develop testing methods and testing vectors that can provide an accurate test of integrated circuits whose gate equivalents are growing in number.

Practical experience shows that the development of testing methods and vectors requires more time, where the increase in time is proportionally larger than the increase in the number of gate equivalents.

SUMMARY OF THE INVENTION

TECHNICAL PROBLEMS

Taking into consideration the background art and the expected tendencies in research and development as described above, one technical problem is to show a testing system that is based on the ability to divide an integrated circuit arrangement into suitable internal function blocks, where input and output nodes that are related to a function block can be connected to input pads and output pads respectively, thereby creating the conditions wherein the sole testing vector adapted to test a specific function block is the only one required to test this function block.

It also ought to be regarded a technical problem to be able to create conditions whereby all function blocks with required connecting conductors can be tested with a method that is based on testing one or more function blocks in sequence, by applying testing vectors or by applying a signal structure to the input pads while evaluating the received signal pattern at the output pads, so that, by means of an intact testing of all individual function blocks, one can assume that the entire integrated circuit is intact.

It also ought to be regarded as a technical problem to be able to realize the need for, and the advantages obtained by, using multiplexers that can be controlled by a control logic within the integrated circuit, to point out the function block or blocks that are to be tested and to be able to create, in a controlled manner, an electrical coaction between the input and output nodes of the selected function blocks and the input and output pads of the integrated circuit.

In addition, it is a technical problem to be able to realize what conditions are required to be able to test the function of the multiplexers, which are built-in between the various function blocks, during the actual testing of one or more function blocks.

Another technical problem is to be able to create conditions so that the above-stated technical problem can be solved without having to alter the testing vectors that are solely intended for a selected function block.

It also ought to be regarded as a technical problem to be able to show a testing method that, when all function blocks within the, integrated circuit arrangement have been tested, one by one, thereby also performs a complete test of the integrated circuit arrangement, including a test of the communication paths between the function blocks.

Another technical problem is being able to show a testing method and a circuit arrangement that include multiplexers for each of the test cells that are related to output pads whose structure allows the normal functional data stream to pass through without any time-lag.

Another technical problem is to be able to realize the importance of, and the advantages obtained by, enabling a completion of a standardized test cell, specifically a BS-cell with a multiplexer arrangement, thereby creating an enhanced BS-output cell; that is, a BS-output cell that can function better than a standardized BS-output cell.

Another technical problem is to be able to show an enhanced or modified BS-output cell that is compatible enough with a standardized BS-output cell that no standardized functions have to be removed.

In addition, it is a technical problem to realize the advantages and the importance of the modification of adding still another multiplexer function to a standardized BS-output cell connection. Further, it is a technical problem to be able to realize where to add this multiplexer function, as well as how to control it, in order not only to solve one or more of the above-stated problems, but also to permit the data stream to flow normally without incurring an extra time-lag.

Another technical problem is to be able to present a simple testing system that can be used even when the function blocks in question are built into Application Specific Integrated Circuits, (ASICs).

Thus, it is a technical problem to create, by simple means, conditions whereby available testing vectors, supplied by the producer of a standardized function block, can be used for these function blocks, and only special testing vectors are required with special function blocks.

It is also a technical problem to realize the importance of creating conditions, and the advantages obtained as conditions are created, to select the required testing vectors as well as the time required to make the test, with respect to the physical and/or functional size and complexity of the function block.

In addition, it ought to be regarded as a technical problem, besides creating the physical and/or functional structure, to create the conditions necessary for dividing the function blocks into a hierarchical order and for adapting testing vectors to them.

There is a technical problem in being able to realize the advantages of being able to use standardized function blocks and their associated testing vectors in technology that differs from the rest of the circuit, while still being able to create the conditions for a simple testing sequence.

Another technical problem is to be able to break the present trend that has testing vectors increasing in multitude and complexity as the number of function blocks and gate equivalents increase, as does the time required to produce these testing vectors.

It is also a technical problem to realize the advantages obtained from being able to divide the integrated circuit arrangement into internal function blocks through internal multiplexers, and to test function block after function block with a test cell, modified and multiplexer-supplemented according to the invention, for respective output.

It is also a technical problem to be able to realize the advantages obtained when a change in function or a modification by adding one or more function blocks requires only the generation of new testing vectors for the function block or blocks that have been altered.

In addition, it is a technical problem to realize what measures and technical modifications are required in each BS-output cell that is used, in order to pass the output signals from the output nodes at a selected internal function block to the connecting pads of the integrated circuit arrangement without interfering with a driver circuit or a driver stage.

It must also be regarded a technical problem to be able to realize the importance of, and the advantages obtained by, creating the conditions for an output cell that is related to an output pad to provide a standardized BS-output cell with an added multiplexer, as well as to realize that this multiplexer is to be connected between a flip-flop that belongs to a standardized BS-cell and a multiplexer that belongs to a driver stage.

There is also a technical problem in being able to realize the importance of, and the advantages obtained by, connecting an output node that belongs to an internal function block or to a functional macro that is obtained from said added multiplexer and to control said multiplexer through a control signal, which is generated by a specific block in the circuit, which block is dedicated to controlling various testing modes in the circuit.

There is a technical problem in realizing the advantages obtained by generating and activating from a Joint Test Action Group logic (JTAG-logic), the mode-selecting signal for the added multiplexer, which principle is already known.

There is also a technical problem in realizing the need for creating conditions whereby a mode-selecting signal for the multiplexer and a mode-selecting signal (or signals) for the added multiplexer are coordinated to appear simultaneously during the test period.

It is also a technical problem to realize the advantages and the conditions associated with using not only a 2:1-multiplexer as an added multiplexer or a multiplexer structure, but even larger multiplexer structures, and the required number of mode-selecting signals or bit combinations.

It is thereby a technical problem to be able to realize the conditions associated with allowing the added multiplexer to consist of an (m+n):1 multiplexer, where "m" is the number of multiplexer inputs connected to outputs or output nodes available for testing, and "n" is the number of multiplexer inputs at which signals from the test cells appear.

There is also a technical problem in realizing the advantages of a multiplexer structure where one input of an added multiplexer can be connected to an output of another added multiplexer, and so on, thereby forming a cascade connection.

In addition, it is a technical problem to create, by simple means, the internal conditions whereby required conductors between the connecting pads and the multiplexers that belong to the function blocks do not increase, or only slightly increase, the load on the signal conductor used by the functional signal structure.

It is also a technical problem to be able to show the use of internal buffer circuits and to realize where these are to be placed within the integrated circuit.

It is also a technical problem to be able to show how the buffer circuits formed in the periphery of the connected circuit can be used so that they reduce the load on the input pads by being connected adjacent to them.

SOLUTION

In order to solve one or more of the above-stated technical problems, the present invention is based on an integrated circuit arrangement with several internal function blocks and edge-oriented bond pads, whereby each of several selected pads is equipped with a test cell; a first test cell configuration for an incoming signal structure at a first set of pads; and a second test cell configuration for an outgoing signal structure at a second set of pads, whereby the test cells can, by means of circuit internal conductors, be connected to at least one function block, which is adapted to process the signal structure that appears at one or more of the first pads, as well as to transmit a signal pattern that appears at one or more second pads, whereby every second test cell is equipped with a multiplexer that can be controlled through a mode-selecting signal to either pass a signal pattern that relates to a function block or a signal pattern that is received from a selected function block, in the form of a test signal.

The invention specifically shows that each second test cell configuration of said second set of pads is equipped with at least one added multiplexer whose output is directly or indirectly connected to an input for test signals belonging to said multiplexer.

A test signal, which originates from a function block that is to be selected for testing, is connected to at least one input of said added multiplexer, which can be controlled by means of a mode-selecting signal.

As proposed embodiments, within the scope of the inventive thought, it is shown that the configuration of every test cell is formed by a basic circuit connection of a BS-output cell configuration.

Several bond pad-related test cells can advantageously be connected in series.

It is specifically shown that during a testing period the added multiplexer is to be activated by at least one mode-selecting signal generated by a control logic.

In order to form a gate connection, it is shown that the added multiplexer is formed by a 2:1-multiplexer, and that a signal from a test cell appears at one input, and an output signal from the selected function block in a selected test appears at the other input.

The added multiplexer can more generally be formed from an (m+n):1-multiplexer where the control logic is adapted to generate one of several available mode-selecting bit combinations for passing along a selected input.

Should the added multiplexer be formed from a multiple-input multiplexer, then the control logic ought to be adapted to generate one, of several available, selected mode-selecting bit combination.

It is specifically shown that a mode-selecting signal or bit combination for the added multiplexer is to be generated and activated from a JTAG-logic.

Otherwise, the mode-selecting signal for the multiplexer and the mode-selecting signal or bit combination for the added multiplexer must be coordinated so that they appear simultaneously during the test period.

An extension of the multiplexer connection can be provided by connecting one input of the added multiplexer to an output of another added multiplexer, whereby the added multiplexer can be formed from a multiple-input multiplexer and the control logic can be adapted to generate one, of several available, selected mode-selecting bit combination.

The added multiplexer can be formed from several multiplexers in a cascade connection.

Buffer circuits are also shown, as their use reduces the load on internal signal conductors.

ADVANTAGES

The prime advantage afforded by an integrated circuit arrangement whose edge-oriented bond pads are totally or partially equipped with test cells; together with the creation of conditions that allow for the input and output signals of internal function blocks, via input and output nodes, to be linked to the connecting pads of the integrated circuit through multiplexers, is that a simple testing method is provided by means of simple testing vectors for each selected function block, where each function block can be tested, one by one in sequence, until every function block is tested with its associated testing vectors, thereby testing the entire integrated circuit without incurring any extra time-lag for a selected circuit arrangement for output test cells of a normal functional signal exchange or data stream.

A physical and/or hierarchical structure of the function blocks is also provided, whereby one or several function blocks can be selected and tested together with internal multiplexers and connecting conductors.

If a change is made in one or more function blocks then only the corresponding testing vector or vectors must be changed.

According to the present invention, the primary characteristic of an integrated circuit arrangement, which stipulates that every selected connecting pad that belongs to the integrated circuit arrangement be equipped with a testing cell that is intended to activate a testing function, is set forth in the characterizing clause of claim 1.

BRIEF DESCRIPTION OF THE DRAWINGS

Exemplifying embodiments of an integrated circuit arrangement, which present the characterizing features of the present invention, are described in more detail, below, with reference to the accompanying drawings, in which:

FIG. 1 shows schematically a previously known connecting arrangement with a first circuit, illustrated as a standardized BS input cell, as an input pad; and a second circuit, illustrated as a standardized BS-output cell, as an output pad;

FIG. 2 shows in parts "A" and "B" a highly simplified schematic circuit diagram of an integrated circuit arrangement that uses a number of pad-related BS-cells that have been modified according to the present invention;

FIG. 5 shows a multiplexer arrangement with one 2:1-multiplexer and one (m+n):1-multiplexer;

FIG. 6 shows schematically a possible division of a function block intended to be tested;

FIG. 7 shows an embodiment of a BS-output cell with a multiplexer arrangement that includes several 2:1-multiplexers in a cascade connection;

FIG. 8 shows a further embodiment of a BS-output cell where testing vectors, which are required for various block parts in an integrated circuit, can be applied when the circuit is mounted on a printed circuit board;

FIG. 9 shows an alternative embodiment of a circuit arrangement that, in function, is equivalent to the circuit arrangement shown in FIG. 8.

DESCRIPTION OF EMBODIMENTS AT PRESENT PREFERRED

Figure 3:
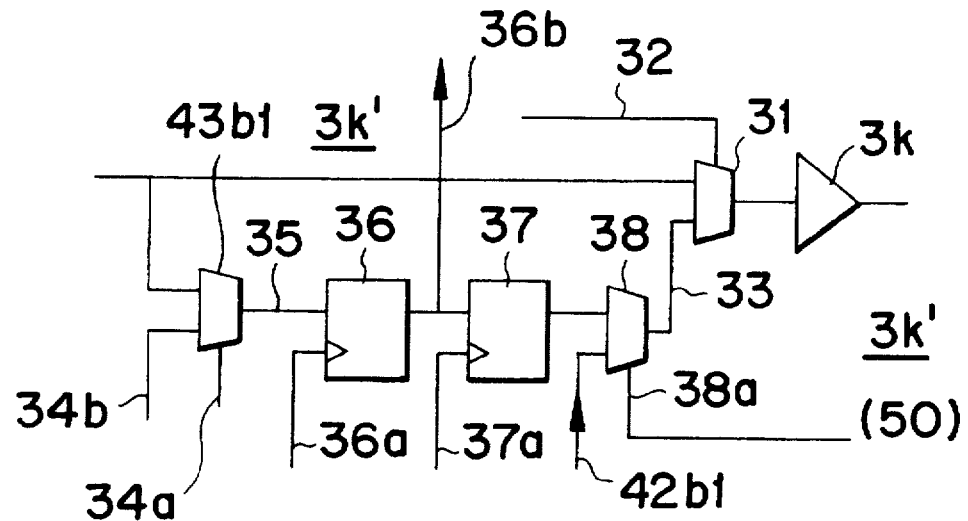
FIG. 3 shows in block schematics a first embodiment of a modified output pad-related BS-output cell that uses one added 2:1-multiplexer according to the present invention.

A previously known integrated circuit arrangement 1 is shown schematically and greatly simplified, with reference to FIG. 1, with a first edge 1a, that belongs to the circuit, and an opposite second edge 1b.

In the illustration, the first edge 1a is equipped with a single terminal or input pin 2—also called an input pad—while the other edge 1b is equipped with a corresponding terminal or output pin 3—also called an output pad.

In practical application, there are several connecting pads that correspond to the input and output pads 2, 3. However, the illustrated connecting pads are sufficient for understanding the present invention, wherefore for the sake of simplicity only these are shown.

For a person skilled in the art it is obvious that selected parts of known I/O-connections may be used as equivalent means.

For the sake of simplicity, only input and output pads and associated input and output cells will be mentioned in the description that follows.

Also for the sake of simplicity, only one direction of signalling will be described; that is, from the connecting pad 2 to the connecting pad 3. This requires certain assumptions, which are well-adapted to the known technology.

For signalling in the opposite direction, the input pad and its associated circuit connection for the test cell must be exchanged with the output pad and its associated circuit connection for the test cell.

To a person skilled in the art, it is obvious that the exchange and a transmission of signals can also be made in the opposite direction.

There is a standardized BS-input cell 2', related to a driver circuit, adjacent to the connecting pad 2; as well as a standardized BS-output cell 3', related to a driver circuit, adjacent to the connecting pad 3.

The BS-input and output cells have different but well-known functions.

There is a chip-related logical system 4 with internal function units or function blocks of various kinds between said BS-cells 2', 3'.

Based on this technology, the present invention shows how an integrated circuit may be divided into function blocks using input and output nodes.

The invention is based on the concept that every function block is structured so that the number of input nodes corresponds, at the most, to the total number of input- and I/O-pads for the integrated circuit in question, and that the number of output nodes corresponds, at the most, to the total number of output- and I/O-pads. Also, the total number of nodes for one function block must not exceed the total number of input-, output-, and I/O-pads.

FIG. 1 shows that the circuit arrangements for the BS-cells 2', 3' are identical. However, these cells are activated in different ways, in order to form either a BS-input cell 2' or a BS-output cell 3'.

A significant embodiment of the present invention is described in greater detail, below, with reference to FIG. 2, where part "A" is meant to be situated adjacent to part "B" so that the function block 42 is whole, and the integrated circuit 1 is equipped with several edge-related terminals or pads 2 . . . 2$k$ with associated standardized BS-input cells 2' . . . 2$k$', which have been adapted to handle an incoming signal structure; for example, information-carrying functional digital signals.

FIG. 2 shows that said input pads 2 . . . 2$k$ and its associated BS-input cells 2' . . . 2$k$' are each directly connected to the input nodes of a first function block 41 by means of a conductor within a bundle of conductors 41$a$. Each input pad 2 . . . 2$k$ is shown in a parallel coaction with the input nodes of the function block 41.

To a person skilled in the art, it is obvious that in other applications the conductors from the input pads 2 . . . 2$k$ could be connected to another function block or to several different function blocks.

This knowledge might also be applied to the remaining function blocks in the exemplifying embodiment. However, for the sake of simplicity, the principles of the invention are described with the function blocks 41, 42, 43 connected to one another in series.

The series connection is described with the output nodes of function block 41 connected to the input nodes of function block 42; the output nodes of function block 42 are connected to the input nodes of function block 43; and the output nodes of function block 43 are connected to the output pads 3 . . . 3$k$.

Each of the outgoing conductors of function block 41, which is coordinated with the bundle 41$b$, could also be connected to one input of a 2:1 multiplexer.

In this case, the other input of the 2:1-multiplexer would be connected to the output of an input cell or an input pad through a conductor 20$a$ and a buffer circuit, that is given the general reference (B).

The output of the 2:1-multiplexer is connected to an input node that belongs to the function block 42.

Note: A buffer circuit (B) 20$a$" is needed to prevent the functional signal conductor 41$a$5 from being loaded with the load from the test conductor 20$a$.

The other buffer circuits (B) shown in FIG. 2 are used for the same purpose.

Thus, FIG. 2 shows in a simplified way, that only one outgoing conductor 41$b$1 is connected to one input of a 2:1-multiplexer 20, whereas the other input is connected to the input pad 2 through a test conductor 20$a$, a buffer circuit (B) 20$a$" and a BS-input cell 2'.

The signals on either the output conductor 41$b$1 from the function block 41 (or one of the input conductors of the multiplexer 20) or the input conductor 20$a$ can be passed through the multiplexer to an input conductor 42$a$1 of the function block 42 by means of a control signal that is generated and originates from a control logic 21.

Ordinarily, the functional data signals that appear on the output conductor 41$b$1 are passed to the input conductor 42$a$1 that belongs to a bundle of input conductors 42$a$ of the function block 42.

The signals at the output 20$c$ of the multiplexer 20 (which is directly connected to the input conductor 42$a$1 of the function block 42) can be linked and connected, over a buffer circuit (B) 20$b$1' and through a conductor 20$b$1, to an outgoing test cell that has been modified according to the present invention. (See FIG. 4.)

The buffer circuit (B) 20$b$1' is oriented adjacent the conductor 42$a$1 in order to reduce the load on this conductor.

The full length of the conductor 20$b$1 would load the impedance value of the conductor 42$a$1 without a connected buffer circuit (B).

Note: If the function block 41 and the multiplexer 20 are to be tested, then an evaluation of the signals at the conductor 41$b$1—linked through the multiplexer 20 to the conductors 42$a$1 and 20$b$1, when the latter is connected to an outgoing test cell—is required.

A test of the function block 41 is performed by applying testing vectors to the input pads 2 . . . 2$k$ and thereby directly to the input nodes 41$a$1 . . . 41$a$5 of the function block 41, while the signal pattern received at the output nodes 41$b$1 . . . 41$b$5 is linked to one of the outgoing pads 3 . . . 3$k$ each via associated test cells 3' . . . 3$k$" through a control signal from the unit 21 on the conductor 20$b$.

Thus it is shown that every outgoing conductor within the bundle of conductors 41$b$ from the function block 41 is connected to one input conductor within the bundle of conductors 42$a$ each to the function block 42 via its own multiplexer (for example, 20), while in another embodiment perhaps only a few, if any, outgoing conductors are connected to a multiplexer and an input of the function block 42.

The second function block 42 is thus illustrated as completely built-in to the integrated circuit 1, and may consist of a standardized block, such as a microprocessor core.

Said microprocessor core 42 is connected with a third function block 43.

It is here illustrated that every outgoing conductor within the bundle of conductors 42$b$ is connected to an input of a 2:1-multiplexer 20' whose other input is connected to one of the input pads 2 . . . 2$k$ or to one of the input cells 2' . . . 2$k$' through a conductor such as 20$a$'.

Thus, it is shown that the outgoing conductor 42$b$1 from the function block 42 and from the multiplexer 20' is directly connected to an input conductor 43a1, within the bundle of conductors 43a, to the function block 43, and that it is directly connected, via a buffer (B) 42b1', to one 3k' of the outgoing test cells 3' ... 3k'.

It is further evident from FIG. 2 that each connecting ingoing pad 2 ... 2k is coordinated with one standardized BS-input cell 2' ... 2k', and that each connecting pad 3 ... 3k is coordinated with its own BS-output cell, after the latter has been modified according to the present invention.

Nevertheless, there is nothing that prevents the input cells from being formed by BS-test cells that are modified according to the present invention, in which case the otherwise mandatory buffer circuit can be omitted.

FIG. 2 also illustrates edge-oriented connecting pads 22, 22a, 22b, 22c, which are intended to be used with various activation and control signals. A brief but more detailed description of these signals is given later in this text.

Note: The circuit can be put into various test modes by means of signals at certain connecting pads in a previously known way.

The invention is based on the concept that every function block 41, 42, 43 within the complete integrated circuit, that can be tested according to the conditions of the present invention, must have block-related input nodes that can be connected to the input pads, and output nodes that can be connected to the output pads.

The necessary connections are usually made through 2:1-multiplexers. However, this is not the case for function blocks hose input and/or output nodes are directly connected to input and/or output pads. Every 2:1-multiplexer may be controlled by signals that are generated by the control logic 21.

The features of the invention will be described in greater detail when the test of the function block 42 is described. However, note that in order to bring selected testing vectors to the coordinated input nodes 42a of the function block 42, it must be possible to connect each input connection, such as 42a1, to its own circuit-related ingoing connecting pad or input cell 2' ... 2k' via its own connecting means (20) through a conductor (20a).

The generated outgoing signal pattern from the function block 42 is presented at the coordinated conductor bundle 42b, within which every conductor is connected to its own circuit-related outgoing connecting pad 3 ... 3k by means of a BS-output cell 3' ... 3k', which is modified according to the present invention, and which directly coacts with its own input connection or node, such as 43a1 in function block 43, whose coordinated output node 43b coacts directly with an output and a BS-output cell.

To a person skilled in the art, it is obvious that if the function block 43 were to be tested, then during the test cycle, each ingoing connection (43a) in the function block 43 must, in a corresponding way, be connectable by means of its own conductor through a multiplexing unit 20' (such as item number 20) with a BS-input cell, such as 2k'. During normal operation, data signals are received from one of the function block's 42 outgoing connections; for example 42b1.

Note also that the linked conductors, such as the latter part of the conductor 42b1, are advantageously equipped with a buffer circuit (B) 42b1', in order to reduce the load on the conductor 43a1. This is specifically advantageous when the conductor 42b1 is long.

The following description is only intended to include the function block 42. The measures required to apply the conditions of function block 42 to any other function block are nevertheless obvious for a person skilled in the art.

To test the function block 42, the testing vectors of the testing period must be stored in the BS-input cells 2' ... 2k' as '1's and '0's.

These testing vectors appear simultaneously as a signal structure at the input nodes (42a) of the function block 42 through a control signal on a conductor to the 2:1-multiplexer connections, such as the conductor 20b of the multiplexer 20; moreover, these signals are processed within the block 42, after which they appear as a signal pattern at the output nodes 42b.

Here we see that each output node is connected to its own 2:1-multiplexer, such as 20' for the conductor 42b1.

The signal pattern at the output nodes 42b is transferred to the BS-output cells 3' ... 3k' (the signal on conductor 42b1 is transferred to the cell 3') through the output of the 2:1-multiplexer 20', which means that even this will be a part of the test, whereby a signal pattern generated by, and depending on, the testing vectors can be registered at the output pads 3 ... 3k.

The function block 42 and one of the inputs of the 2:1-multiplexer units are correct if the signal pattern is correct. An error signal is generated if the signal pattern is not correct.

The other input of the multiplexer is tested when the testing vectors are applied to the function block 43.

Not shown here is the required comparison of a received signal pattern with a stored signal pattern. However, this comparison can be made using previously known testing equipment that is arranged in the periphery.

The BS-output cells 3' ... 3k' -which have been modified according to the present invention- of the output pads 3 ... 3k are in one embodiment formed according to the circuit arrangement illustrated and described in FIG. 3.

Given the circuit arrangement according to FIG. 3, which applies to a BS-output cell 3k', the following may be considered.

The conductor 43b1 illustrates an outgoing conductor from the function block 43, through which, via a connecting pad 3k, a signal—which has been processed in the integrated circuit 1 of function block 43—is to be passed. This is done through a multiplexer 31, which passes the circuit-related functional data signal on the conductor 43b1 to the output connection 3k through a mode-selecting signal that appears on conductor 32.

Another signal on the conductor 33 is passed through another mode-selecting signal on the conductor 32.

A signal appears on this conductor 33 as a mode-selecting signal on conductor 38a which controls a 2:1-multiplexer 38. A signal that appears on an ingoing conductor 42b1 will be passed on the conductor 33 when a first signal is disposed on the conductor 38a.

This ingoing conductor 42b1 registers the signal pattern at an output node of the tested function block 42.

Thus, the mode-selecting signal on conductor 38a is supposed to put the 2:1-multiplexer 38 in a mode that has been selected for the test.

The conductor 33 will pass a signal that appears on a conductor from a flip-flop 37 when a second signal is disposed on the conductor 38a.

According to FIG. 3, the circuit connection can also be used for a BS-input cell (2k'). However, in this case, an output buffer for the connection pad 3k is to be omitted.

13

We also see that an input signal, which appears on the conductor 43b1, may also be connected as an input signal to a 2:1-multiplexer 34, which by means of a mode-selecting signal on the conductor 34a, passes either the signal on conductor 43b1, or a scanning signal that appears on conductor 34b, to a conductor 35.

The signal on conductor 34b is a signal from an earlier BS-input cell in a BS-loop.

The signal that appear on conductor 35, which is passed through the multiplexer 34, may be connected to a first flip-flop arrangement 36.

The momentary signal on conductor 35 is passed as a testing vector to the following BS-inout cell in the BS-loop, through the conductor 36, via a clock signal on the conductor 36a.

The flip-flop 37 can pass a signal to an input connection of an added 2:1-multiplexer 38 through a clock signal on conductor 37a. In turn, the multiplexer 38 can through a control signal From a JTAG-logic 50 on conductor 38a, pass either the signal that was stored on the flip-flop 37, or a signal from the function block 42 that appeared on the conductor 42b1.

Figure 4:
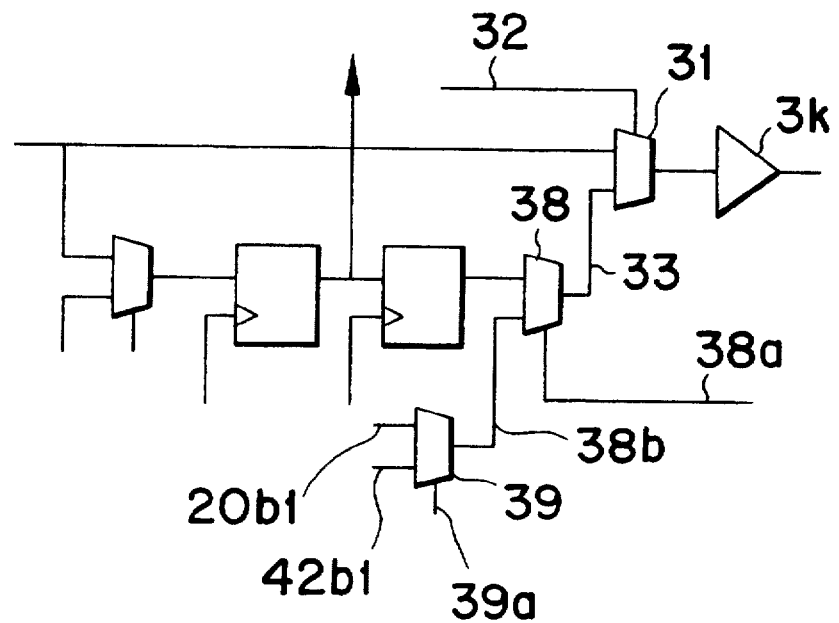
FIG. 4 shows a second embodiment of a modified output pad-related BS-output cell that uses two added 2:1-multiplexers according to the present invention.

FIG. 4 shows a further embodiment, where the signals from two function blocks that are intended to be tested can be registered; for example, function blocks 41, 42. A control signal on the conductor 39a, which is generated by the control logic 21, then selects one of these two signals through a 2:1-multiplexer 39.

When the function block 41 is tested, one input is supposed to be connected to the conductor 20b1; the other input is connected to the conductor 42b1 when the function block 42 is tested.

Thus, the output signal from the selected function block is passed over the conductor 38b to one input of the 2:1-multiplexer 38. The multiplexer 38 is controlled via a control signal on the conductor 38a in the manner previously described.

FIG. 2 illustrates that a BS-loop (numbered 25) may be connected via a bus through input and output connections or cells.

The invention is further based on the principle that complex function blocks 42, such as the one shown in FIG. 6, can be divided into smaller block units, each of which can be tested with fewer testing vectors, and that the block units can be tested one after the other.

According to FIG. 6, the division is intended to illustrate that each block unit 421–429 can be tested separately.

This requires that conductors and a 2:1-multiplexer be placed between the connecting pads (2 and 3 respectively) and each block unit 421–429 that makes up the test system.

Note: These block units 421–429 do not necessarily need to be equal in size or complexity. However, the structure of each block unit should be selected according to its function and its testing vectors. The blocks may also be selected in an hierarchical order. One block unit, such as 424, may be divided into several partial block units that can be tested with testing vectors at the same level.

Some or all of these test block units may then be divided into still smaller blocks and tested at their level.

In FIG. 2, the function of a testing period is performed via a control unit 21 (50), to which a "Test Data In" (TDI) signal can be connected to the connecting pad 22, to which a "Test Mode Control" (TMC) signal can be connected to the connecting pad 22a, to which a "Test Clock" (TCK) signal can be connected to the connecting pad 22b, after which a "Test Data Out" (TDO) signal appears at the connecting pad 22c.

14

Thus, the required testing vectors are passed through the pad 22, and occupy, in series, the BS-cells 2'–2k', which are solely used when the circuit is mounted on a printed circuit board.

The selection of multiplexer 38 and its structure is vital for the invention.

Preferably, a 2:1-multiplexer is connected according to FIG. 3, in order to connect the signal pattern from the tested function block, thereby creating the conditions necessary to form a multiplexer-modified BS-output cell.

Nonetheless, practical applications may require other, more complex multiplexer structures.

FIG. 5 shows one such multiplexer structure. One input of the 2:1-multiplexer 38 is connected to the output of an (m+n):1-multiplexer 39, where "m" corresponds to the number of outputs or output nodes that are available for testing, and "n" corresponds to the number of signals from the test cell.

Multiplexers 39 of this kind require the control unit 21 to generate control signals in the form of bit combinations on the conductors 39a, 39a', where the number of conductors depends on the number of inputs.

FIG. 7 is meant to illustrate several 2:1-multiplexers in a cascade connection. These multiplexers can be replaced with 4:1-, 8:1-, 16:1- or 32:1-multiplexers that have 2, 3, 4, or 5 control connections.

FIGS. 8 and 9 are meant to illustrate how testing vectors may be applied to various blocks in an integrated circuit while using a BS-loop with modified BS-output cells.

The circuit arrangements pictured use an added multiplexer 38 whose connection is different from those in FIGS. 3 and 4.

These circuit arrangements may be suitable when testing one or more blocks within an integrated circuit, provided the integrated circuit is mounted on a printed circuit board.

With respect to the modified BS-cells, the circuit arrangement pictured makes it possible to pass testing vectors to small individual function blocks within the circuit, and to clock the output results of the BS-cells from these internal blocks.

The reference numerals in FIGS. 8 and 9 correspond to the circuits and conductors shown in FIGS. 3 and 4.

Used buffer circuits have been given the general reference (B) and specific buffer circuits have thereto been given a complementing reference numeral.

The embodiments described in FIGS. 3, 4 and 7 are referred to by the description that an output 33 of the added multiplexer 38 is directly connected to a test signal-related input of the multiplexer 31 and the embodiments described in FIGS. 8 and 9 are referred to by the description of an indirect connection.

The invention is not restricted to the illustrated exemplifying embodiments thereof. Modifications can be made within the scope of inventive thought as illustrated in the following claims.

I claim:

1. Integrated circuit arrangement with several internal related function blocks, (such as 42) and edge-oriented bond pads (2 . . . 2k; 3 . . . 3k), whereby each of a number of selected pads is equipped with a test cell; a first test cell (2k') for an incoming signal structure at a first set of pads (2k); and a second test cell (3k') for an outgoing signal structure at a second set of pads (3k), whereby the test cells can be connected, through internal connecting conductors (20a, 42b1), to at least one function block (42) for processing the signal structure that appears at one or more of the first pads (2–2k), and for transmitting a signal pattern that appears at one or more of the second pads (3–3k); thus, every second test cell (3k') is equipped with a multiplexer (31), which can be controlled through a mode-selecting signal (32), in order to pass either a signal pattern (43b1) that is related to a function block, or a signal pattern (42b1, 33) that is received from a selected function block, in the form of a test signal, characterized in, that each second test cell (3'–3k') of said second set of pads (3–3k) is equipped with an added multiplexer (38); that the output (33) of said added multiplexer (38) is, directly (FIG. 3) or indirectly (FIG. 8), connected to a test signal-related input of said multiplexer (31); that a test signal (42b1), which originates from a function block (42) that has been selected to be tested, is connected to at least one input of said added multiplexer (38); and that said added multiplexer (38) may also be controlled by means of a mode-selecting signal (38a).

2. Circuit arrangement according to claim 1, characterized in, that the test cell (3k') is formed by the basic circuit connection of a BS-cell.

3. Circuit arrangement according to claim 2, characterized in that one input of the added multiplexer is connected to an output of another added multiplexer.

4. Circuit arrangement according to claim 1, characterized in, that a number of bond pad-related test cells are connected in series.

5. Circuit arrangement according to claim 4, characterized in that one input of the added multiplexer is connected to an output of another added multiplexer.

6. Circuit arrangement according to claim 1, characterized in, that during a testing period, the added multiplexer (38) can be activated by at least one mode-selecting signal (38a) generated by a control logic (21, 50).

7. Circuit arrangement according to claim 6, characterized in that the added multiplexer is formed by an (m+n):1-multiplexer (39); and that the control logic is adapted to generate one of several available mode-selecting bit combinations for a passing of a selected input.

8. Circuit arrangement according to claim 1, characterized in, that the added multiplexer is formed by a 2:1-multiplexer; that a signal from a test cell appears at one input; and that an output signal from the selected function block in a selected test appears at the other input.

9. Circuit arrangement according to claim 1, characterized in, that the added multiplexer is formed by an (m+n):1-multiplexer (39); and that the control logic is adapted to generate one of several available mode-selecting bit combinations for a passing of a selected input.

10. Circuit arrangement according to claim 6, characterized in, that the added multiplexer (38) is formed by a multiple-input multiplexer; and that the control logic (21, 50) is adapted to generate one of several available mode-selecting bit combinations.

11. Circuit arrangement according to claim 1, characterized in, that a mode-selecting signal or bit combination for the added multiplexer (38) is generated and activated from a JTAG-logic (50).

12. Circuit arrangement according to claim 1, characterized in, that the mode-selecting signal for the multiplexer and the mode-selecting signal or bit combination for the added multiplexer are coordinated to appear simultaneously during the test period.

13. Circuit arrangement according to claim 1, characterized in, that one input of the added multiplexer is connected to an output of another added multiplexer.

14. Circuit arrangement according to claim 13, characterized in, that the added multiplexer (38) is formed by a multiple-input multiplexer; and that the control logic (21, 50) is adapted to generate one of several available mode-selecting bit combinations.

15. Circuit arrangement according to claim 1, characterized in, that the added multiplexer is formed by a number of multiplexers in a cascade connection.

16. Circuit arrangement according to claim 1, characterized in, that a buffer circuit (B) is connected adjacent to a function block-related signal conductor; and that said buffer circuit is adapted to reduce the load from an internal connecting conductor.

* * * * *